(12) United States Patent
Lee et al.

(10) Patent No.: US 11,868,040 B2
(45) Date of Patent: Jan. 9, 2024

(54) METHOD FOR FORMING TARGET SUBSTRATE AND ELECTRONIC DEVICE

(71) Applicant: InnoLux Corporation, Miao-Li County (TW)

(72) Inventors: Chien-Hsing Lee, Miao-Li County (TW); Chin-Lung Ting, Miao-Li County (TW); Jung-Chuan Wang, Miao-Li County (TW); Hong-Sheng Hsieh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/681,145

(22) Filed: Feb. 25, 2022

(65) Prior Publication Data

US 2022/0179305 A1 Jun. 9, 2022

Related U.S. Application Data

(62) Division of application No. 16/715,929, filed on Dec. 16, 2019, now Pat. No. 11,294,273.

(60) Provisional application No. 62/925,922, filed on Oct. 25, 2019.

(51) Int. Cl.
*G03F 1/60* (2012.01)

(52) U.S. Cl.
CPC .................................... *G03F 1/60* (2013.01)

(58) Field of Classification Search
CPC ........................................................ G03F 1/60
USPC ............................................................ 430/5
See application file for complete search history.

(56) References Cited

U.S. PATENT DOCUMENTS 5,691,115 A * 11/1997 Okamoto ............ G03F 7/70466
430/311
2018/0164677 A1 * 6/2018 Son .......................... G03F 1/50

* cited by examiner

*Primary Examiner* — Christopher G Young
(74) *Attorney, Agent, or Firm* — McClure, Qualey & Rodack, LLP (57) ABSTRACT

A method for forming a target substrate is provided. The method includes providing a mask substrate. The method also includes providing a second base with a material layer. The method further includes arranging the mask substrate and the second base correspondingly. In addition, the method includes performing exposure and development processes on the material layer to form the target substrate and removing the mask substrate.

6 Claims, 11 Drawing Sheets

METHOD FOR FORMING TARGET SUBSTRATE AND ELECTRONIC DEVICE

CROSS REFERENCE TO RELATED APPLICATIONS

This application is a Divisional of application Ser. No. 16/715,929, filed Dec. 16, 2019, now U.S. Pat. No. 11,294,273, which claims the benefit of U.S. Provisional Application No. 62/925,922 filed on Oct. 25, 2019, the entirety of which is incorporated by reference herein.

BACKGROUND

Field of the Invention

The present invention relates to a mask substrate and method for forming a mask substrate, and using a mask substrate to form a target substrate and/or electronic device.

Description of the Related Art

Currently, performing a photo lithography process for manufacturing thin-film transistors (TFT), liquid crystal display, organic light-emitting diodes (OLED) display and/or other devices generally needs a plurality of masks. However, the cost for developing different kinds of masks may be relatively high, and re-design these masks may be time-consuming and complicated. These disadvantages may prejudice the development of new products. Therefore, a novel mask structure is desirable.

BRIEF SUMMARY

Some embodiments of the disclosure provide a method for forming a target substrate, including: providing a mask substrate and providing a second base with a material layer. The method also includes arranging the mask substrate and the second base correspondingly, performing exposure and development processes on the material layer to form the target substrate and removing the mask substrate.

Some embodiments of the disclosure provide a method for forming an electronic device, including: providing a mask substrate and providing a second base with a material layer. The method also includes arranging the mask substrate and the second base correspondingly, performing exposure and development processes on the material layer to form a target substrate. The method further includes removing the mask substrate, and using the target substrate to form the electronic device.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE INVENTION

The mask substrates and methods for forming target substrate of some embodiments of the present disclosure are described in the following description. The specific embodiments disclosed are provided merely to clearly describe the usage of the present disclosure by some specific methods without limiting the scope of the present disclosure.

In addition, in this specification, relative expressions may be used. For example, "lower", "bottom", "higher" or "top" are used to describe the position of one element relative to another. It should be noted that if a device is flipped upside down, an element that is "lower" will become an element that is "higher".

It should be understood that, although the terms "first", "second" etc. may be used herein to describe various elements, regions, layers and/or portions, and these elements, regions, layers, and/or portions should not be limited by these terms. These terms are only used to distinguish one element, component, region, layer, or portion. Thus, a first element, component, region, layer or portion discussed below could be termed a second element, component, region, layer or portion without departing from the teachings of some embodiments of the present disclosure.

In addition, the phrase "in a range from value A to value B" used herein is intended to encompass a numerical range between the value A and the value B, and the values A and B are also included.

Figure 1:
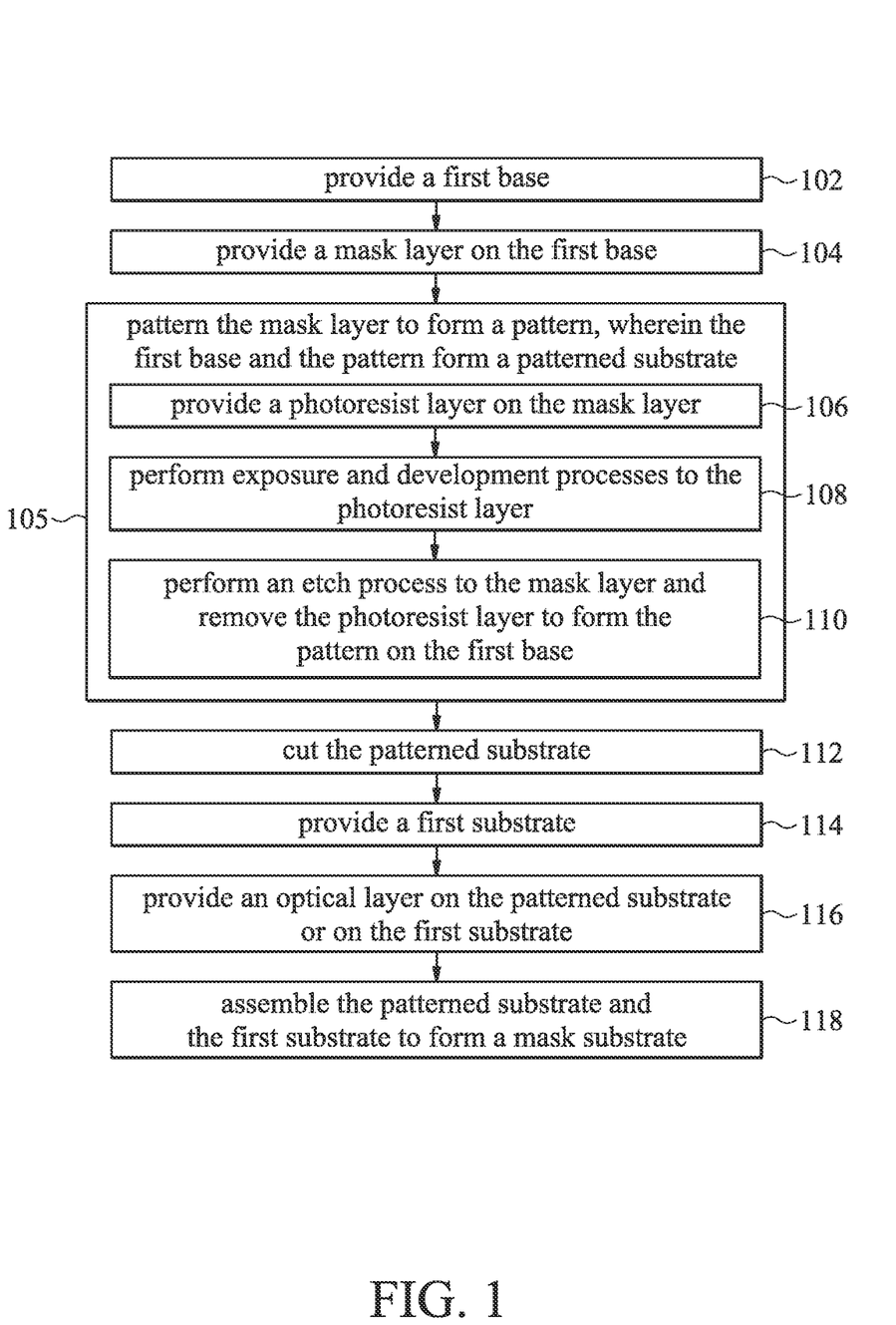
FIG. 1 is a flow chart illustrating a method of forming a mask substrate in accordance with some embodiments of the present disclosure.

FIG. 1 is a flow chart illustrating a method 100 of forming a mask substrate in accordance with some embodiments of the present disclosure. At operation 102, a first base is provided. In some embodiments, a material of the first base may include glass, quartz, Polyimide (PI), polyethylene terephthalate (PET), any other suitable transparent material, or a combination thereof, but it is not limited thereto. At operation 104, a mask layer is provided on the first base. For example, the material of the mask layer may include conductive materials, insulating materials, or any other suitable material, as long as the mask layer may be used to form a pattern, but it is not limited thereto. In some embodiments, the mask layer may be a dark material, which may help for forming a pattern, but it is not limited thereto.

At operation 105, the mask layer is patterned to form a pattern, and the first base and the pattern form a patterned substrate. In an embodiment, the operation 105 may include operations 106, 108 and 110. At operation 106, a photoresist layer is provided on the mask layer. At operation 108, exposure and development processes are performed to the photoresist layer for subsequent etch process, forming a patterned photoresist layer. Then, at operation 110, an etch process is performed to the mask layer form a pattern on the first base. In some embodiments, the pattern of the mask layer may be the same as that of the patterned photoresist layer, those skilled in the art may adjust these patterns as required, and the detailed description will not be provided in the following paragraphs. After the etch process is completed, the photoresist layer is removed, and the pattern is remained on the first base. At this point, the patterned substrate is formed (comprising the first base with the pattern disposed thereon).

In some embodiments, at the operation 105, patterning the mask layer may be performed by a process of Laser direct imaging without exposure, development and etch processes, then correspondingly to form a pattern on the first base After patterning the mask layer (i.e. the operation 105), at operation 112, the patterned substrate may be cut to a suitable size. In some embodiments, in the operation 112, an area of the first substrate may be greater than or equal to an area of the patterned substrate. It should be noted that the operation 112 is optional. At operation 116, an optical layer is provided on the patterned substrate or on the first substrate, wherein a refractive index of the optical layer is in a range from 1 to 2.3. In another embodiment, the refractive index of the optical layer is in a range from 1.45 to 1.55. In some embodiments, the refractive index of the optical layer may be substantially similar to the refractive index of the glass. At operation 118, the patterned substrate and the first substrate are assembled to form a mask substrate. In some embodiments, the optical layer may include transparent adhesive, sputtering film (e.g. SiOx, SiNx, $Nb_2O_5$, $Al_2O_3$, etc.), liquid crystal, index-matching liquid (e.g. oil), any other suitable material or a combination thereof, but it is not limited thereto. After the operation 118, the first substrate and/or the patterned substrate may also be optionally cut, making the size (e.g. area or width) of the first substrate is the same as or different from the size of the patterned substrate. It should be noted that the above steps of the method 100 provided herein serve as an example, and those skilled in the art may adjust the method 100 as required. That is, additional operation may be performed, some of the operation may be omitted, and/or the order of the operations may be changed.

Figure 2:
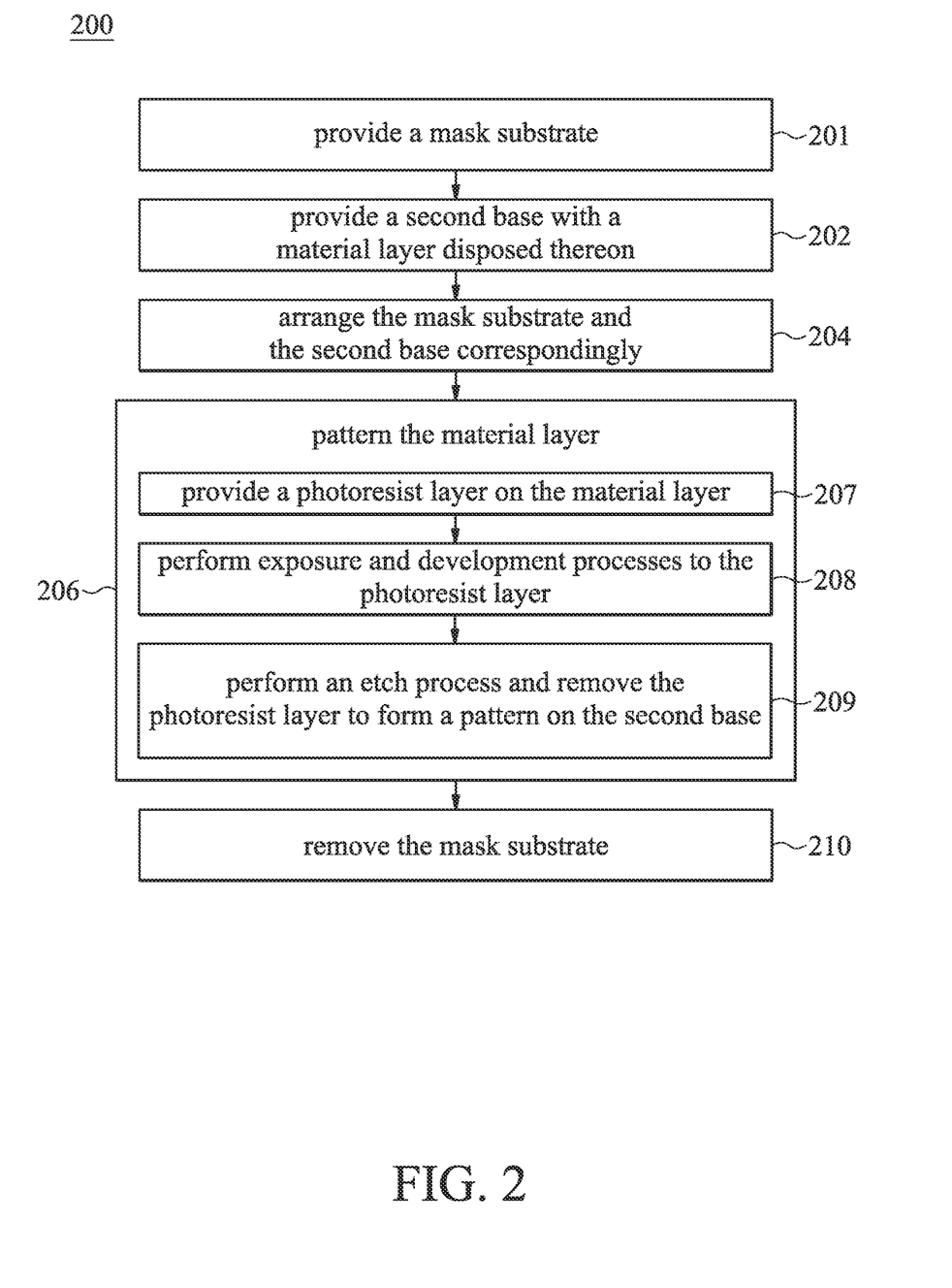
FIG. 2 is a flow chart illustrating a method of forming a target substrate in accordance with some embodiments of the present disclosure.

FIG. 2 is a flow chart illustrating a method 200 of forming a target substrate in accordance with some embodiments of the present disclosure. At operation 201, a mask substrate is provided. For example, the mask substrate is formed by the above method 100, but the present disclosure is not limited thereto. The mask substrate recited in the operation 201 may refer to any substrate with a mask disposed thereon. At operation 202, a second base is provided, and a material layer may be disposed thereon. For example, the material layer may include conductive materials, insulating materials, any other suitable material or a combination thereof. In some embodiments, the insulating materials may be transparent materials or dark materials. For example, a material of the second base may include glass, quartz, polyimide (PI), polyethylene terephthalate (PET), any other suitable transparent material, or a combination thereof, but it is not limited thereto. At operation 204, arrange the mask substrate (such as the mask substrate formed by the method 100) and the second base correspondingly.

At operation 206, the material layer is patterned. In the present embodiment, the operation 206 may include operations 207, 208 and 209. At operation 207, a photoresist layer is provided on the material layer. At operation 208, exposure and development processes are performed to the photoresist layer for subsequent etch process. Then the photoresist layer may be transformed to the patterned photoresist layer which follows the designed pattern of the mask substrate. Then, at operation 209, an etch process is performed, and the photoresist layer is removed to form a pattern on the second base. In some embodiment, forming the target substrate may include providing other mask substrates and repeating operations 202 to 210 to form at least another pattern on the second base. At operation 210, the mask substrate is removed after the operation 206, remaining the second base as the target substrate.

Figure 3A:
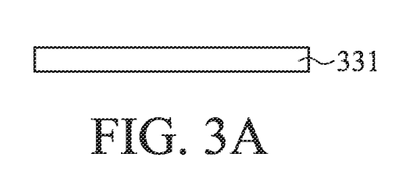
FIG. 3A-3F are cross-sectional views illustrating the process of forming the patterned substrate in accordance with some embodiments of the present disclosure.
Figure 3B:
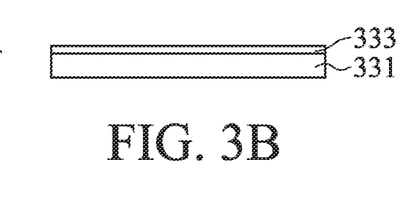
Figure 3C:
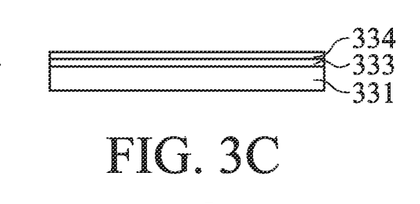
Figure 3D:
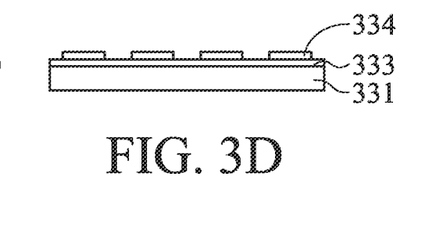
Figure 3E:
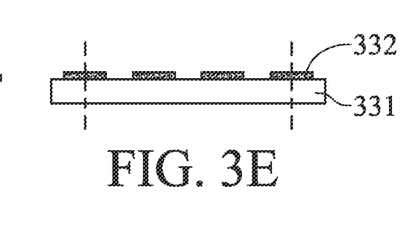
Figure 3F:
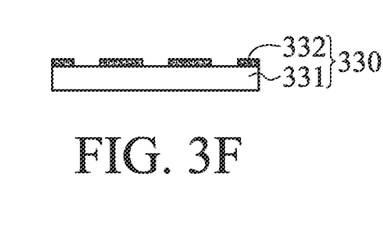

FIG. 3A-3F are cross-sectional views illustrating the process of forming the patterned substrate 330 in accordance with some embodiments of the present disclosure. As shown in FIG. 3A, a first base 331 is provided. Then, a mask layer 333 is formed on the first base 331, as shown in FIG. 3B. Afterward, as shown in FIG. 3C-3D, a photoresist layer 334 is provided on the mask layer 333, and performing exposure and development processes to pattern the photoresist layer. An etch process is performed to the mask layer 333, and a pattern 332 is formed on the first base 331. In addition, the patterned photoresist layer 334 is removed, forming the patterned substrate. Optionally, as shown in FIG. 3F, the patterned substrate may be cut after the etch process is completed, forming the patterned substrate 330. It should be noted that those skilled in the art may determine whether the cutting process is performed based on the design. In some embodiments, the patterned substrate 330 is formed without the cutting process.

Figure 4A:
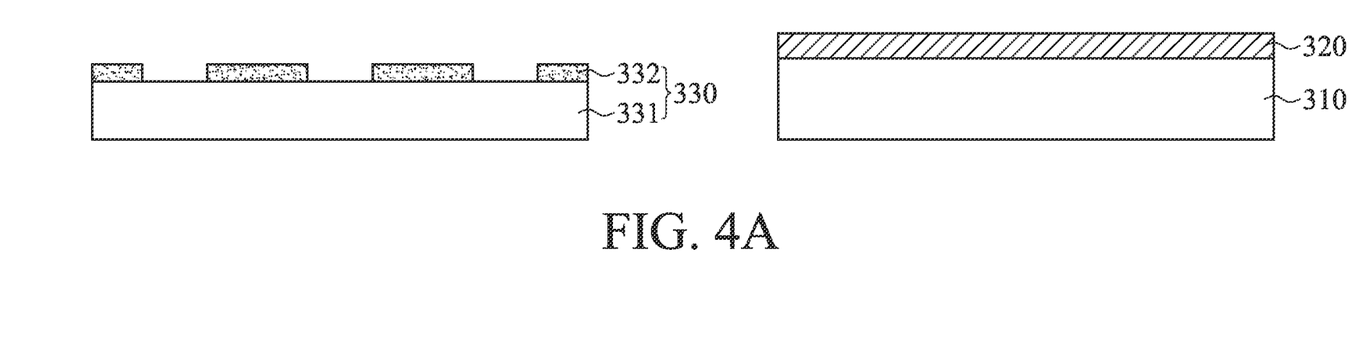
FIG. 4A-4B are cross-sectional views illustrating the process of forming the mask substrate in accordance with some embodiments of the present disclosure.
Figure 4B:
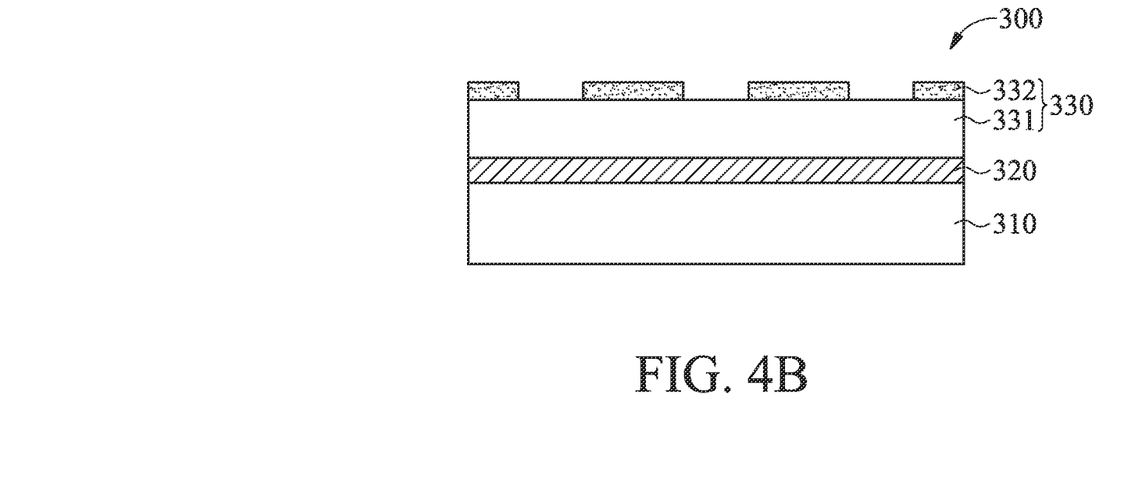

FIG. 4A-4B are cross-sectional views illustrating the process of forming the mask substrate in accordance with some embodiments of the present disclosure. As shown in FIG. 4A-4B, an optical layer 320 is provided on a first substrate 310, and then the first substrate 310 and the patterned substrate 330 are assembled, forming a mask substrate. In the present embodiment, the optical layer 320 is separated from the pattern 332. The detailed description of the mask substrate in the present embodiment will be provided in the following paragraphs.

Figure 5A:
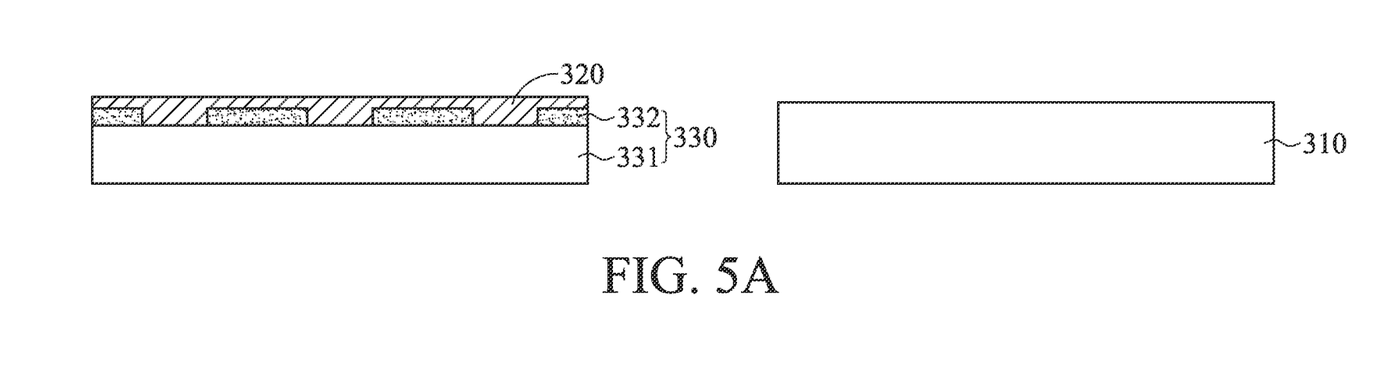
FIG. 5A-5B are cross-sectional views illustrating the process of forming the mask substrate in accordance with some embodiments of the present disclosure.
Figure 5B:
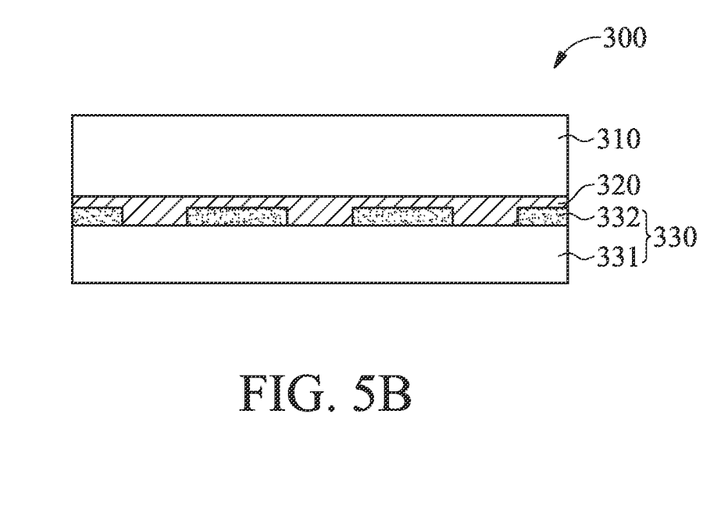

FIG. 5A-5B are cross-sectional views illustrating the process of forming the mask substrate in accordance with some embodiments of the present disclosure. As shown in FIG. 5A-5B, an optical layer 320 is provided on the patterned substrate 330, and then the first substrate 310 and the patterned substrate 330 are assembled, forming a mask substrate. In the present embodiment, the optical layer 320 is in contact with the pattern 332. The detailed description of the mask substrate in the present embodiment will be provided in the following paragraphs.

FIG. 4B and FIG. 5B are cross-sectional views illustrating the mask substrate 300 in accordance with some embodiments of the present disclosure. As shown in FIGS. 4B/5B, the mask substrate 300 includes a first substrate 310, an optical layer 320 and a patterned substrate 330. The optical layer 320 is disposed between the first substrate 310 and the patterned substrate 330. For example, the optical layer 320 may include transparent adhesive, sputtering film (e.g. SiOx, SiNx, $Nb_2O_5$, $Al_2O_3$, etc.), liquid crystal, index-matching liquid (e.g. oil), any other suitable material or a combination thereof, but it is not limited thereto. In some embodiments, a refractive index of the optical layer may be in a range from 1 to 2.3. In another embodiment, the refractive index of the optical layer may be in a range from 1.45 to 1.55. In some embodiments, the refractive index of the optical layer is substantially similar to the refractive index of the glass. By means of the above design, the light transmittance of the mask substrate 300 may be improved.

Figure 6:
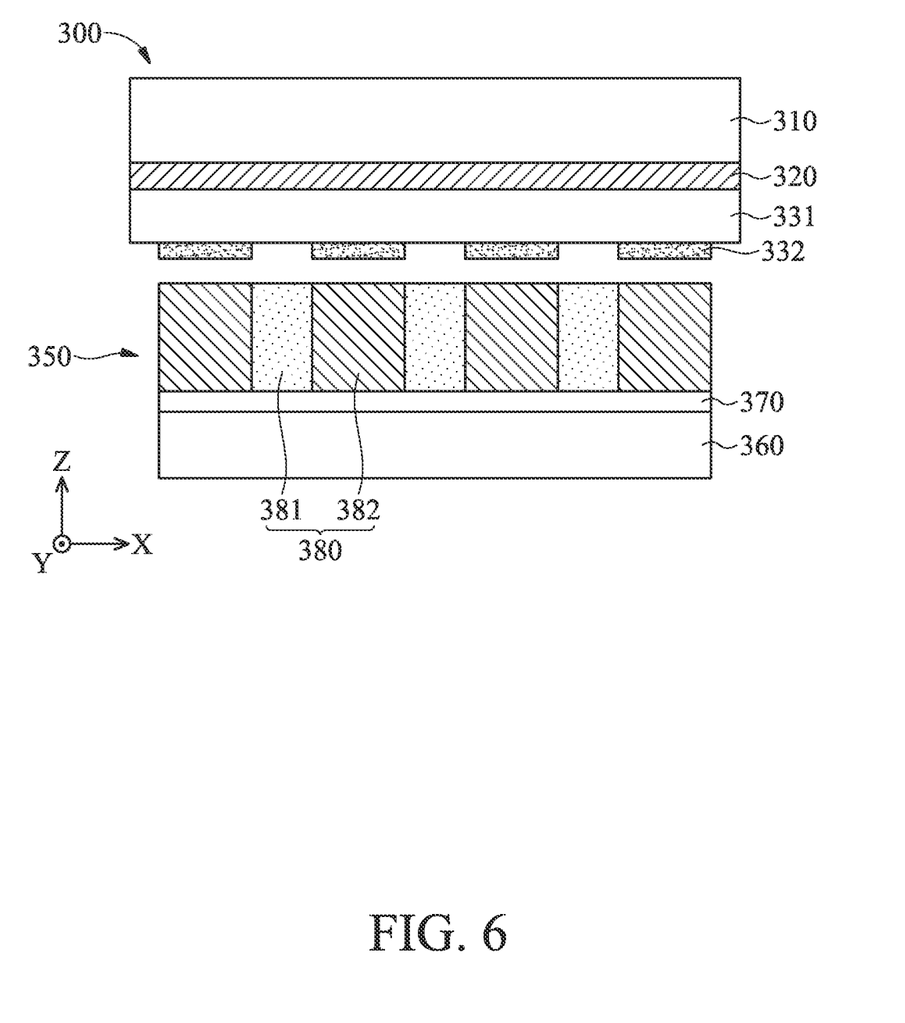
FIG. 6 is a cross-sectional view illustrating an intermediate stage of forming the target substrate in accordance with some embodiments of the present disclosure.

FIG. 6 is a cross-sectional view illustrating an intermediate stage of forming a target substrate 350 in accordance with some embodiments of the present disclosure. In the present embodiment, a second base 360 is provided, and a material layer 370 is disposed on the second base 360. For example, the material layer 370 may include metallic materials, insulating materials, any other suitable material or a combination thereof. In order to perform an etch process to the material layer 370 on the second base 360 to form the target substrate 350, a photoresist layer 380 is formed on the material layer 370. The mask substrate 300 is arranged corresponding to the second base 360. In the present embodiment, the mask substrate 300 is arranged directly above the second base 360.

An exposure process may be performed to the photoresist layer 380 through the mask substrate 300. As a result, the photoresist layer 380 includes an exposed portion 381 and a covered portion 382, wherein the exposed portion 381 may be exposed from the pattern 332, and the covered portion 382 may be covered by the pattern 332. In some embodiments, the photoresist layer 380 includes a positive photoresist, such that the exposed portion 381 may be removed, and the covered portion 382 may be remained on the material layer 370. In some other embodiments, the photoresist layer 380 includes a negative photoresist, such that the exposed portion 381 may be remained on the material layer 370, and the covered portion 382 may be removed.

FIG. 6, the pattern 332 is disposed away from the optical layer 320. In other words, the pattern 332 is not in contact with the optical layer 320. It is noted that the pattern 332 can be disposed between the optical layer 320 and the first base 331. In an embodiment, the pattern 332 is disposed between the second base 360 and the first base 331. In an embodiment, the first base 331 is disposed between the pattern 332 and the second base 360. In an embodiment, the first substrate 310, the optical layer 320 and the first base 331 may be transparent, but the pattern 332 may be opaque, and therefore the mask substrate 300 serve as a mask for an exposure process that is performed to the photoresist layer 380. For example, a material of the first substrate 310 and/or the first base 331 may include glass, quartz, polyimide (PI), polyethylene terephthalate (PET), any other suitable transparent material, or a combination thereof, but it is not limited thereto. And a material of the second base 360 may include glass, quartz, polyimide (PI), polyethylene terephthalate (PET), any other suitable transparent material, or a combination thereof, but it is not limited thereto.

Figure 7:
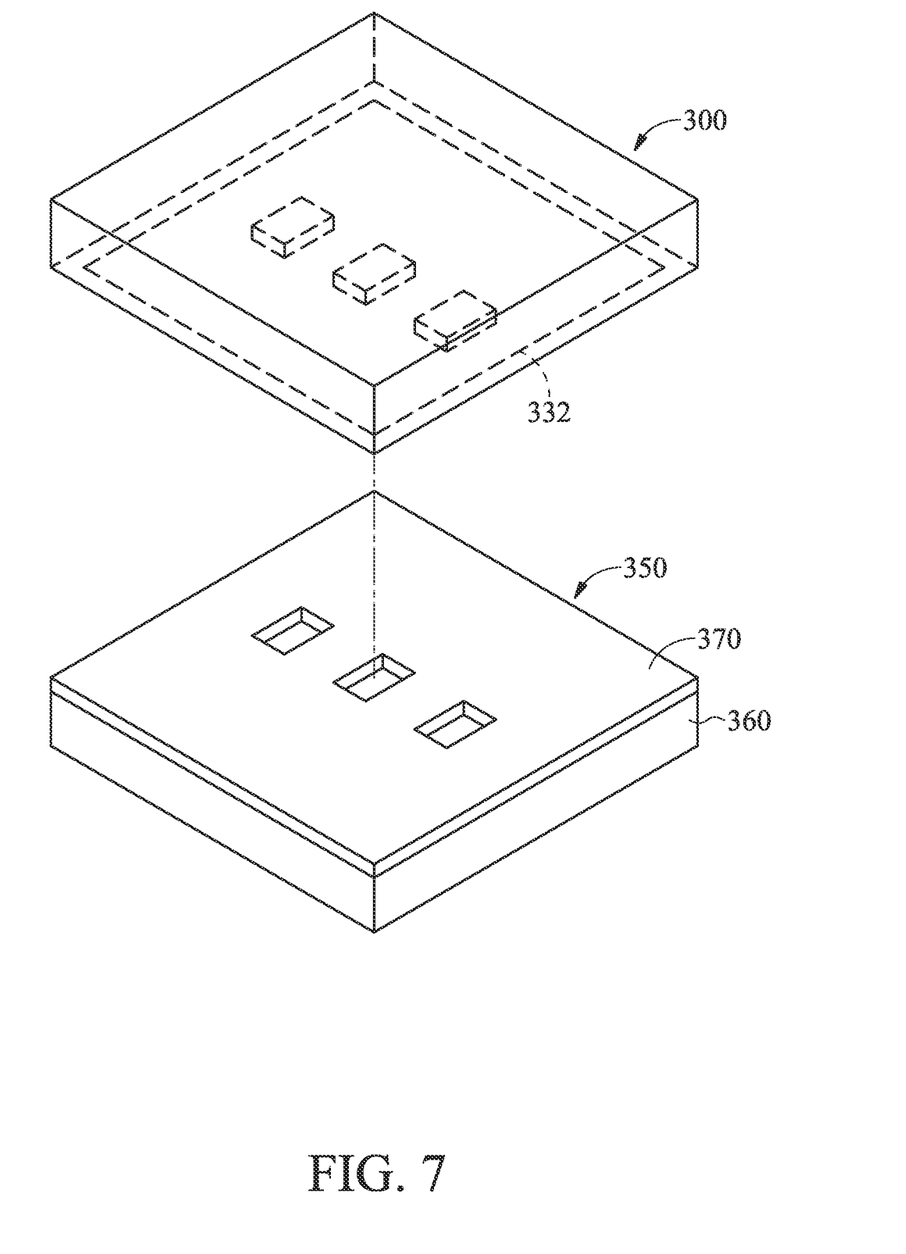
FIG. 7 is a perspective view illustrating the mask substrate and the target substrate in accordance with some embodiments of the present disclosure.

FIG. 7 is a perspective view illustrating the mask substrate 300 and the target substrate 350 in accordance with some embodiments of the present disclosure. As shown in FIG. 6, after the exposure process performed to the photoresist layer 380, the mask substrate 300 may be removed and is reusable. That is, the mask substrate 300 may be arranged on another second base and configured to form another device. Then, an etch process is performed to the material layer 370 via the remaining photoresist layer 380, and the remaining photoresist layer 380 is removed after the etch process is completed, forming a patterned material layer 370 (another pattern corresponding to the pattern 332) on the second base 360. It is noted that the shape of the pattern 332 in the present embodiment is an illustrative example, and those skilled in the art may arbitrarily adjust the shape of the pattern 332 as required. Moreover, additional operation may also be performed on the target substrate 350, and for the sake of simplicity, it will not be discussed in the following paragraphs.

Figure 8:
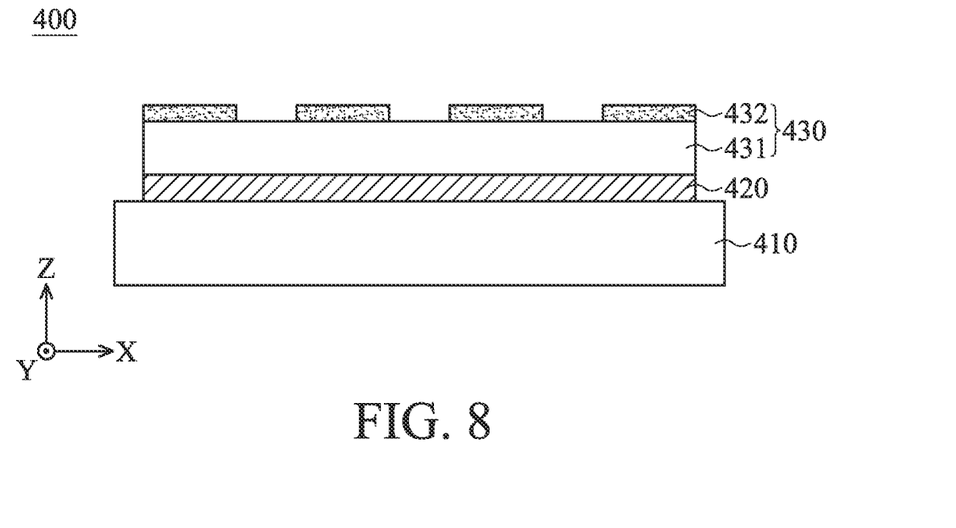
FIG. 8 is a cross-sectional view illustrating the mask substrate in accordance with some other embodiments of the present disclosure.

FIG. 8 is a cross-sectional view illustrating the mask substrate 400 in accordance with some other embodiments of the present disclosure. It is noted that the mask substrate 400 in the present embodiment may include the same or similar portions as the mask substrate 300 shown in FIGS. 4B, 5B. The same or similar portions are denoted by similar numerals for ease of identification, and will not be discussed in detail in the following paragraphs. For example, the mask substrate 400 includes a first substrate 410, an optical layer 420 and a patterned substrate 430. The difference between the mask substrate 400 in the present embodiment and the mask substrate 300 shown in FIGS. 4B, 5B is that an area of the first substrate 410 is greater than an area of the patterned substrate 430, wherein the areas of the first substrate 410 and the patterned substrate 430 are measured in a horizontal plane (e.g. X-Y plane). In another embodiment, the difference between the mask substrate 400 in the present embodiment and the mask substrate 300 shown in FIGS. 4B, 5B is that an width of the first substrate 410 is greater than a width of the patterned substrate 430, wherein the width of the first substrate 410 and the patterned substrate 430 are measured in X direction or Y direction. In some embodiments, the patterned substrate 430 may be cut before assembled with the first substrate 410. In some other embodiments, the patterned substrate 430 may be cut after assembled with the first substrate 410. The reduced size (e.g. area or width) of the patterned substrate 430 exposes a portion of the first substrate 410 which is configured for fixing or arranging the first substrate 410 during using the mask substrate 400 to perform the exposure process.

Figure 9:
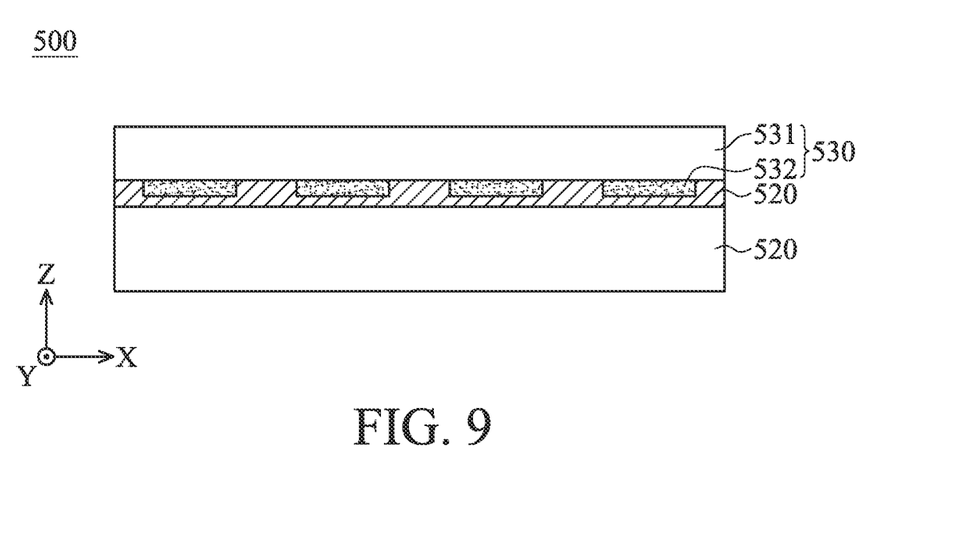
FIG. 9 is a cross-sectional view illustrating the mask substrate in accordance with some other embodiments of the present disclosure.

FIG. 9 is a cross-sectional view illustrating the mask substrate 500 in accordance with some other embodiments of the present disclosure. It is noted that the mask substrate 500 in the present embodiment may include the same or similar portions as the mask substrate 300 shown in FIGS. 4B, 5B. The same or similar portions are denoted by similar numerals for ease of identification, and will not be discussed in detail in the following paragraphs. For example, the mask substrate 500 includes a first substrate 510, an optical layer 520 and a patterned substrate 530. The difference between the mask substrate 500 in the present embodiment and the mask substrate 300 shown in FIGS. 4B, 5B is that the pattern 532 of the pattern substrate 530 faces the first substrate 510 and is in contact with the optical layer 520. In the present embodiment, a portion of the optical layer 520 is disposed between the pattern 532 and the first substrate 510. In some other embodiment, the pattern 532 may be in direct contact with the first substrate 510, and therefore no optical layer 520 would be disposed directly below the pattern 532.

As shown in FIG. 9, the size of the patterned substrate 530 corresponds to the size (e.g. area or width) of the first substrate 510. However, the present embodiment merely serves as an example. In some other embodiments, the size of the patterned substrate 530 may be greater than or smaller than the size of the first substrate 510.

Figure 10:
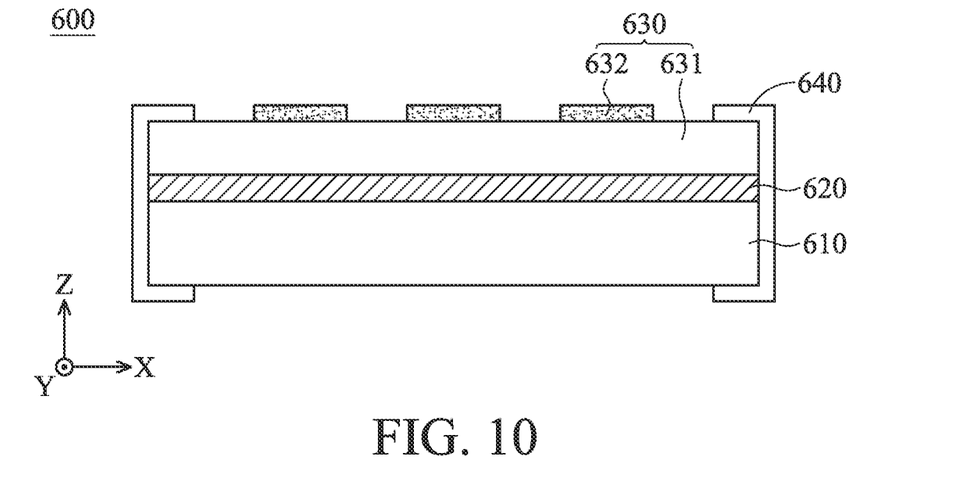
FIG. 10 is a cross-sectional view illustrating the mask substrate in accordance with some other embodiments of the present disclosure.

FIG. 10 is a cross-sectional view illustrating the mask substrate 600 in accordance with some other embodiments of the present disclosure. It is noted that the mask substrate 600 in the present embodiment may include the same or similar portions as the mask substrate 300 shown in FIGS. 4B, 5B. The mask substrate 600 includes a first substrate 610, an optical layer 620 and a patterned substrate 630. The difference between the mask substrate 600 in the present embodiment and the mask substrate 300 shown in FIGS. 4B, 5B is that the mask substrate 600 further includes a protective layer 640 disposed on a lateral side of the patterned substrate 630. That is, as in view of a horizontal direction (e.g. parallel to the X axis that is perpendicular to the Z axis), the protective layer 640 may overlap with the first substrate 610, the optical layer 620 and/or the patterned substrate 630.

As shown in FIG. 10, the size of the patterned substrate 630 corresponds to the size of the first substrate 610. However, in some other embodiments, the size of the patterned substrate 630 may be greater than or smaller than the size of the first substrate 610. In some embodiments where the size of the patterned substrate 630 is different from the size of the first substrate 610, the protective layer 640 may be conformally disposed on lateral sides of the first substrate 610 and/or the patterned substrate 630. In some other embodiments, the protective layer 640 may not directly contact one of the lateral sides of the first substrate 610 and/or the patterned substrate 630.

In some embodiments, the protective layer 640 may also partially cover an upper side and/or a lower side of the mask substrate 600. That is, when viewed from a normal direction (e.g. parallel to the Z axis), the protective layer 640 may partially overlap with at least one of the first substrate 610, the optical layer 620 and the patterned substrate 630. In some embodiments, the protective layer 640 surrounds the first substrate 610, the optical layer 620 and/or the patterned substrate 630. For example, the protective layer 640 may include glues, mechanical components, any other suitable material, component or a combination thereof. By means of the above design, the mask substrate 600 may be protected from damage causing by foreign objects.

Figure 11:
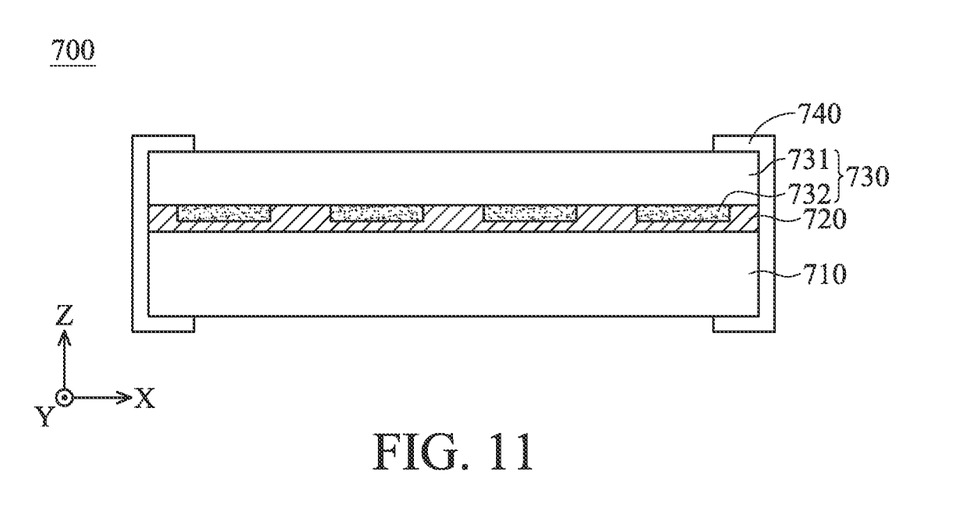
FIG. 11 is a cross-sectional view illustrating the mask substrate in accordance with some other embodiments of the present disclosure.

FIG. 11 is a cross-sectional view illustrating the mask substrate 700 in accordance with some other embodiments of the present disclosure. It is noted that the mask substrate 700 in the present embodiment may include the same or similar portions as the mask substrate 500 shown in FIG. 7. The mask substrate 700 includes a first substrate 710, an optical layer 720 and a patterned substrate 730. As shown in FIG. 11, the size of the patterned substrate 730 corresponds to the size of the first substrate 710. However, in some other embodiments, the size of the patterned substrate 730 may be greater than or smaller than the size of the first substrate 710. Similarly, in some embodiments where the size of the patterned substrate 730 is different from the size of the first substrate 710, the protective layer 740 may be conformally disposed on lateral sides of the first substrate 710 and/or the patterned substrate 730. In some other embodiments, the protective layer 740 may not directly contact one of the lateral sides of the first substrate 710 and/or the patterned substrate 730.

The difference between the mask substrate 700 in the present embodiment and the mask substrate 500 shown in FIG. 7 is that the mask substrate 700 further includes a protective layer 740 disposed on a lateral side of the first substrate 710 and/or the patterned substrate 730. For example, the protective layer 740 may include glues, mechanical components, any other suitable material, component or a combination thereof. The arrangement of the protective layer 740 is similar to the arrangement of the protective layer 640 as recited above, and will not be repeated again. It should be noted that the protective layer 740 does not contact the pattern 732 in the present embodiment, but it merely serves as an example. In some other embodiments, the protective layer 740 may be in contact with the pattern 732.

Figure 12:
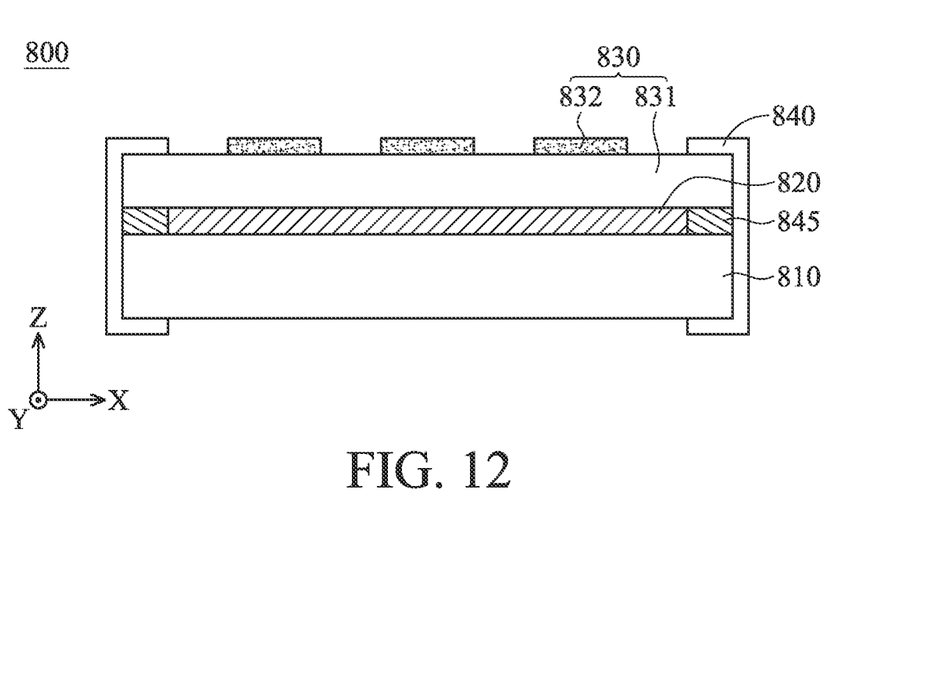
FIG. 12 is a cross-sectional view illustrating the mask substrate in accordance with some other embodiments of the present disclosure.

FIG. 12 is a cross-sectional view illustrating the mask substrate 800 in accordance with some other embodiments of the present disclosure. It is noted that the mask substrate 800 in the present embodiment may include the same or similar portions as the mask substrate 600 shown in FIG. 8. The mask substrate 800 includes a first substrate 810, an optical layer 820, a patterned substrate 830 and a protective layer 840. For example, the protective layer 840 may include glues, mechanical components, any other suitable material, component or a combination thereof.

The difference between the mask substrate 800 in the present embodiment and the mask substrate 600 shown in FIG. 8 is that the mask substrate 800 further includes an adhesive 845 located outside the optical layer 820. In the present embodiment, the adhesive 845 may be disposed between the first substrate 810 and the patterned substrate 830. In addition, the adhesive 845 may also be disposed between the optical layer 820 and the protective layer 840. By means of the above design, the structural strength of the mask substrate 800 may be enhanced.

As shown in FIG. 12, the size of the patterned substrate 830 corresponds to the size of the first substrate 810. However, in some other embodiments, the size of the patterned substrate 830 may be greater than or smaller than the size of the first substrate 810. In some embodiments where the size of the patterned substrate 830 is different from the size of the first substrate 810, the adhesive 845 may be aligned with one of the lateral sides of the first substrate 810 and/or the patterned substrate 830. In the above embodiments, the adhesive 845 may be in contact with the protective layer 840. However, in some other embodiments, a gap may be formed between the adhesive 845 and the protective layer 840.

Figure 13:
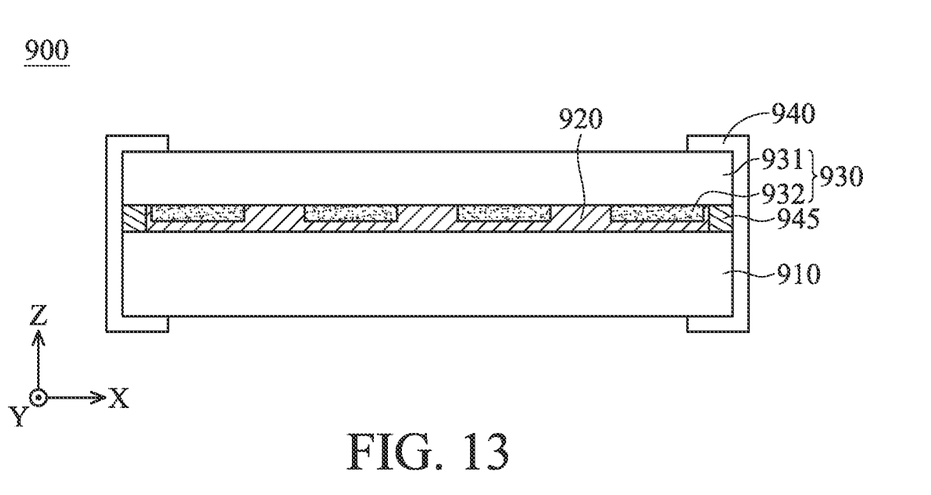
FIG. 13 is a cross-sectional view illustrating the mask substrate in accordance with some other embodiments of the present disclosure.

FIG. 13 is a cross-sectional view illustrating the mask substrate 900 in accordance with some other embodiments of the present disclosure. It is noted that the mask substrate 900 in the present embodiment may include the same or similar portions as the mask substrate 700 shown in FIG. 9. The mask substrate 900 includes a first substrate 910, an optical layer 920, a patterned substrate 930 and a protective layer 940. The difference between the mask substrate 900 in the present embodiment and the mask substrate 700 shown in FIG. 9 is that the mask substrate 900 further includes an adhesive 945 located outside the optical layer 920. The arrangement of the adhesive 945 is similar to the arrangement of the adhesive 845 as recited above, and will not be repeated again. It should be noted that the adhesive 945 does not contact the pattern 932 in the present embodiment, but it merely serves as an example. In some other embodiments, the adhesive 945 may be in contact with the pattern 932. As a result, the fixity of the patterned substrate 930 and the first substrate 910 may be enhanced.

Figure 14:
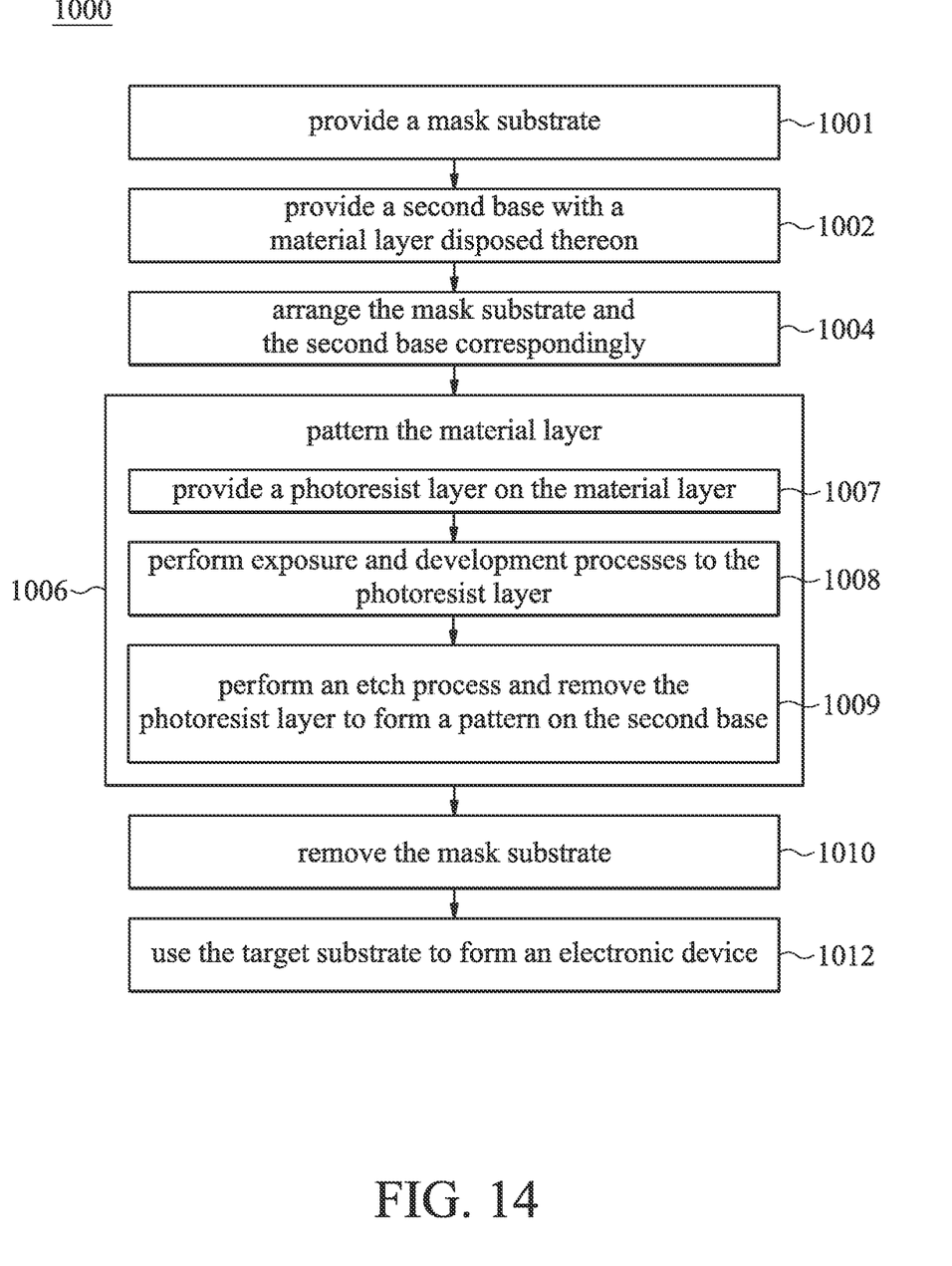
FIG. 14 is a flow chart illustrating a method of forming an electronic device in accordance with some embodiments of the present disclosure.

FIG. 14 is a flow chart illustrating a method 1000 of forming an electronic device in accordance with some embodiments of the present disclosure. The method 1000 includes operations 1001 to 1010 for forming a target substrate, which is similar to the method 200 as set forth above. The method further includes operation 1012, where the target substrate formed after the operation 1010 may be used to form an electronic device. The formed target substrate may serve as any suitable portion of the electronic device. For example, the target substrate may be an array substrate, a touch substrate, a color filter substrate, a touch substrate, an antenna substrate, a circuit wiring substrate or a printed circuit board in the electronic device. That is to say, the target substrate may be any substrate to be formed with a mask to perform exposure and development processes. The electronic device may comprise a display device, a sensing device, an antenna device, a tiled device, a touch device, other suitable electronic devices, or a combination thereof, but is not limited thereto.

For the sake of simplicity, the target substrate illustrated in the present disclosure is formed by using single mask substrate. However, the target substrate in some embodiments may be formed by using multiple mask substrates and performing multiple patterning processes. Namely, some of the operations included in the methods 200 and 1000 may be repeated, substituted and/or omitted in order to form the target substrate and the electronic device as required.

As set forth above, a mask substrate with a patterned substrate is provided. The patterned substrate may be formed by performing some processes such as exposure and development processes and/or Laser direct imaging process. In this way, the pattern on the patterned substrate may be changed as required whenever necessary, making it easy to form the mask substrate. In addition, the mask substrate may further include a protective layer and/or an adhesive for better protection or structural strength of the mask substrate. Moreover, a target substrate may be further formed using the mask substrate. The target substrate may be an array substrate, a touch substrate, an antenna substrate or any other target substrate formed by performing exposure and development processes which requires a mask.

While the embodiments and the advantages of the present disclosure have been described above, it should be understood that those skilled in the art may make various changes, substitutions, and alterations to the present disclosure without departing from the spirit and scope of the present disclosure. It should be noted that different embodiments in the present disclosure may be arbitrarily combined as other embodiments as long as the combination conforms to the spirit of the present disclosure. In addition, the scope of the present disclosure is not limited to the processes, machines, manufacture, composition, devices, methods and steps in the specific embodiments described in the specification. Those skilled in the art may understand existing or developing processes, machines, manufacture, compositions, devices, methods and steps from some embodiments of the present disclosure. Therefore, the scope of the present disclosure includes the aforementioned processes, machines, manufacture, composition, devices, methods, and steps. Furthermore, each of the appended claims constructs an individual embodiment, and the scope of the present disclosure also includes every combination of the appended claims and embodiments.

What is claimed is:

1. A method for forming a target substrate, comprising:
providing a mask substrate, wherein providing the mask substrate comprises:
assembling a first substrate and a patterned substrate; and
cutting the patterned substrate after the assembly of the first substrate and the patterned substrate, wherein in a cross section view, a width of the first substrate is greater than or equal to a width of the patterned substrate;
providing a second base with a material layer;
arranging the mask substrate and the second base correspondingly;
performing exposure and development processes on the material layer to form the target substrate; and
removing the mask substrate.

2. The method as claimed in claim 1, wherein the patterned substrate comprises a first base and a pattern.

3. The method as claimed in claim 2, wherein the pattern is disposed between the second base and the first base.

4. The method as claimed in claim 3, wherein the first base is disposed between the pattern and the second base.

5. The method as claimed in claim 1, wherein the operation of performing exposure and development processes on the material layer further comprises forming an another pattern on the second base.

6. A method for forming an electronic device, comprising:
providing a mask substrate, wherein providing the mask substrate comprises:
assembling a first substrate and a patterned substrate; and
cutting the patterned substrate after the assembly of the first substrate and the patterned substrate, wherein in a cross section view, a width of the first substrate is greater than or equal to a width of the patterned substrate;
providing a second base with a material layer;
arranging the mask substrate and the second base correspondingly;
performing exposure and development processes on the material layer to form a target substrate;
removing the mask substrate; and
using the target substrate to form the electronic device.

* * * * *